United States Patent
Franklin et al.

(10) Patent No.: US 9,593,297 B2
(45) Date of Patent: Mar. 14, 2017

(54) COMPOSITIONS FOR REMOVING RESIDUES AND RELATED METHODS

(71) Applicant: Micron Technology, Inc., Boise, ID (US)

(72) Inventors: Cole S. Franklin, Boise, ID (US); Jerome A. Imonigie, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 89 days.

(21) Appl. No.: 14/514,656

(22) Filed: Oct. 15, 2014

(65) Prior Publication Data

US 2016/0108348 A1    Apr. 21, 2016

(51) Int. Cl.

| | | |
|---|---|---|
| C11D 7/50 | (2006.01) | |
| C11D 11/00 | (2006.01) | |
| C11D 7/04 | (2006.01) | |
| C11D 7/32 | (2006.01) | |
| C11D 7/06 | (2006.01) | |
| C11D 7/08 | (2006.01) | |
| C11D 7/26 | (2006.01) | |
| H01L 45/00 | (2006.01) | |

(52) U.S. Cl.
CPC ............ *C11D 11/0047* (2013.01); *C11D 7/04* (2013.01); *C11D 7/06* (2013.01); *C11D 7/08* (2013.01); *C11D 7/261* (2013.01); *C11D 7/3209* (2013.01); *C11D 7/3245* (2013.01); *H01L 45/06* (2013.01); *H01L 45/1233* (2013.01); *H01L 45/1253* (2013.01); *H01L 45/141* (2013.01); *H01L 45/1608* (2013.01)

(58) Field of Classification Search
CPC .................................................. C11D 11/0047
See application file for complete search history.

(56) References Cited

U.S. PATENT DOCUMENTS

| | | |
|---|---|---|
| 6,323,169 B1 | 11/2001 | Abe et al. |
| 6,372,410 B1 | 4/2002 | Ikemoto et al. |
| 6,514,352 B2 | 2/2003 | Gotoh et al. |
| 6,762,132 B1 | 7/2004 | Yates |
| 7,753,974 B2 | 7/2010 | Miyabe et al. |
| 7,947,130 B2 | 5/2011 | Lee |
| 8,062,429 B2 | 11/2011 | Lee |
| 2004/0142835 A1 | 7/2004 | Takashima |
| 2009/0203566 A1* | 8/2009 | Lee .................... G03F 7/425 510/175 |
| 2010/0105595 A1 | 4/2010 | Lee |
| 2010/0261632 A1 | 10/2010 | Korzenski et al. |
| 2014/0135246 A1 | 5/2014 | Mizutani et al. |

FOREIGN PATENT DOCUMENTS

| | | |
|---|---|---|
| WO | 2013101907 A1 | 7/2013 |
| WO | 2013138276 A1 | 9/2013 |

* cited by examiner

*Primary Examiner* — Gregory Webb
(74) *Attorney, Agent, or Firm* — TraskBritt

(57) ABSTRACT

Compositions for removing residues from a semiconductor structure. The compositions comprise water, a base, a polydentate chelator, a degasser, and a fluorine source. The compositions comprise greater than or equal to approximately 99 wt % of the water and are formulated to exhibit a pH of from approximately 10.0 to approximately 12.0. Methods of forming and using the compositions are also disclosed.

26 Claims, 1 Drawing Sheet

COMPOSITIONS FOR REMOVING RESIDUES AND RELATED METHODS

FIELD

Embodiments disclosed herein relate to semiconductor device fabrication and compositions and methods for use during the same. More specifically, embodiments disclosed herein relate to compositions for removing residues and methods of forming and using such compositions.

BACKGROUND

Due to rapid growth in use and applications of digital information technology, there are demands to continuingly increase the memory density of memory devices while maintaining, if not reducing, the size of the devices. Three-dimensional (3D) structures have been investigated for increasing the memory density of a device. For example, 3D cross-point memory cells have been investigated as devices with increased capacity and smaller critical dimensions. These 3D structures include stack structures of memory cells that may include chalcogenide materials, conductive materials, and, optionally, organic materials.

The stack structures are formed from a variety of materials, such as chalcogenide materials, organic (i.e., carbon) materials, or other sensitive materials, that are sensitive to downstream processing conditions. Following the formation of these materials, the materials are etched to form the stack structures. Since the stack structures are formed of many different materials, post-etch residues remaining on the stack structures include a complex mixture of materials. Conventionally, the post-etch residues on the stack structures may be removed by cleaning with compositions that include acetic acid, citric acid, oxalic acid, dilute ammonium hydroxide ($NH_4OH$), hydrogen fluoride (HF), or combinations thereof. However, the variety of materials in the stack structures makes etching, post-etch cleaning, and other downstream processes difficult because no single, conventional composition is useful to remove all residues. In addition, since the stack structures include different chalcogenide materials, there are volatility, solubility, and electrochemical potential differences between the chalcogen elements and metal elements of the chalcogenide materials that need to be balanced. These differences cause cross contamination of the metal elements of the chalcogenide materials during post-etch cleaning with conventional compositions. The conventional compositions are typically solvent-based or acid-based to decrease galvanic corrosion and other damage of the stack structures. For example, metal elements of the chalcogenide materials in the stack structures may migrate from one part of the cell structure to another when contacted with the conventional compositions. In the presence of the solvent-based or acid-based compositions, these metal elements or chalcogen elements may diffuse and form insoluble complexes with other materials of the stack structures, which poisons the memory cells, leads to programming issues, and reduces the electrical performance of a semiconductor structure including the stack structures. In addition, organic materials of the stack structures are damaged by the conventional solvent-based or acid-based compositions. To reduce damage to the different materials of the stack structures, multiple compositions may be used to clean the stack structures. Alternatively, the stack structure may be formed in multiple acts to minimize damage to the stack structures. However, using multiple compositions or multiple processing acts add complexity to the overall fabrication process.

DETAILED DESCRIPTION

Figure 1:
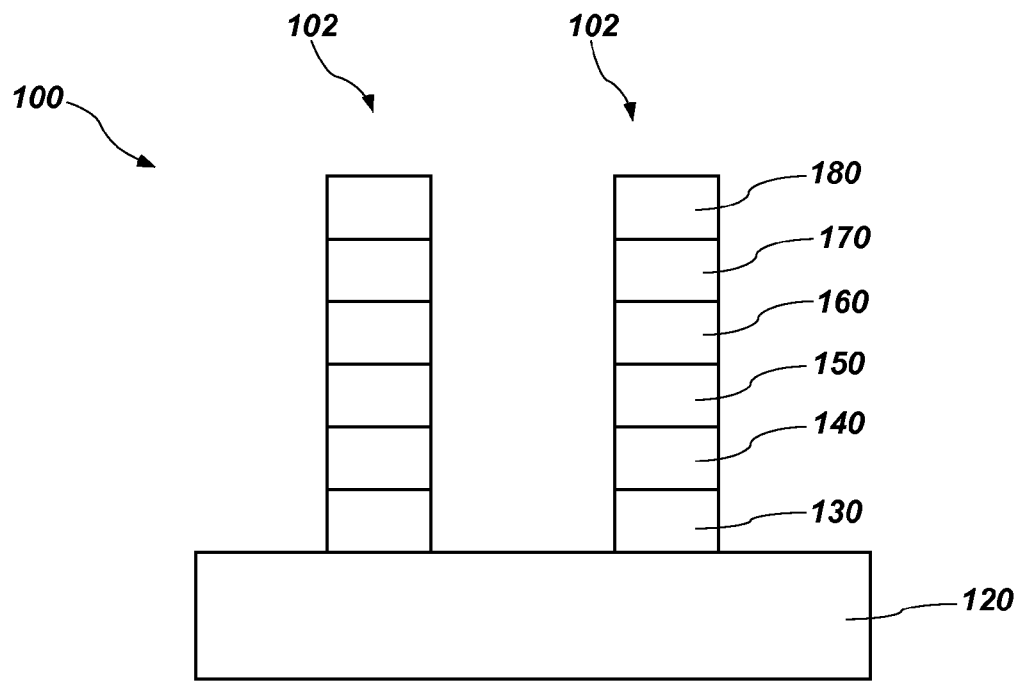
FIG. 1 is a simplified cross-sectional view of a cross-point memory structure exposed to compositions according to embodiments of the disclosure.

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing 3D semiconductor structures, and the structures described below do not form a complete semiconductor device. Only those process acts and structures necessary to understand the embodiments described herein are described in detail below. Additional acts to form a complete semiconductor device including the structures described herein may be performed by conventional techniques.

A composition for removing residues from a semiconductor structure is disclosed. As used herein, the term "residues" means and includes undesirable materials produced by downstream processing acts following formation of stack structures of the semiconductor structure. The residues may be formed from exposed materials of the stack structures, such as exposed chalcogenide materials, exposed organic materials, or other exposed materials. The stack structures may include at least one exposed chalcogenide material, such as two exposed chalcogenide materials. The stack structures may, optionally, include an exposed organic material, such as an exposed carbon material. By way of example only, the residues may be post-etch residues produced following the formation of the stack structures and may include, but are not limited to, metal oxides, chalcogen oxides, metalloid oxides, metal nitrides, chalcogen nitrides, metalloid nitrides, resputtered metals, resputtered chalcogenide materials, resputtered metalloid materials, or organic materials. The composition may be used to remove, for example, the post-etch residues from the stack structures without damaging other materials of the stack structure, such as the chalcogenide materials and the organic material. In addition to at least one chalcogen element, the chalcogenide materials of the stack structure may include at least one metal element or at least one metalloid element, such as antimony, arsenic, germanium, or indium. In addition to removing the residues, the composition of the disclosure is tailored to manage the electrochemical potentials of the metal or metalloid elements while reducing or eliminating the diffusion or migration of the metal or metalloid elements.

The composition may be substantially aqueous in that the composition includes greater than approximately 95% by weight (wt %) of water, such as greater than or equal to approximately 99 wt % of water, greater than or equal to approximately 99.2 wt % of water, greater than or equal to approximately 99.4 wt % of water, or greater than or equal to approximately 99.5 wt % of water. In some embodiments, the composition includes greater than or equal to approximately 99.5 wt % of water. The composition may be a basic composition, having a pH of from approximately 10.0 to approximately 12.0, such as from approximately 10.0 to approximately 11.0 or from approximately 10.2 to approximately 11.0.

The composition may include water, a base, a polydentate chelator, a degasser, and a fluorine source. The ingredients of the composition other than the water may account for less than approximately 5 wt % of the composition, such as less than approximately 1 wt % of the composition, less than or equal to approximately 0.8 wt % of the composition, or less than or equal to approximately 0.5 wt % of the composition. In some embodiments, the composition includes less than or equal to approximately 0.5 wt % of the ingredients other than water.

The water in the composition may be deionized (DI) water, such as degassed DI water or nitrogenated, degassed DI water.

The base in the composition may be an organic base or an inorganic base, such as tetramethylammonium hydroxide (TMAH), tetraethylammonium hydroxide, ammonia, ammonium hydroxide, an alkaline or alkali metal hydroxide, or combinations thereof. The base may provide a high pH, such as from approximately 10.0 to approximately 12.0, to the composition when present in the composition at a low concentration. The base may be present in the composition in an excess relative to the polydentate chelator so that the polydentate chelator is present in the composition in a deprotonated form. The selection of the base in the composition may also enable the fluorine source to be present in the composition without substantially affecting the pH of the composition. In some embodiments, the base is TMAH. The TMAH may be present in the composition at a sufficient concentration to provide a pH in the above range. The TMAH may be present in the composition at from approximately 0.090 wt % to approximately 0.198 wt %, such as from approximately 0.099 wt % to approximately 0.18 wt %. By way of example only, the composition may include from approximately 100 ml/l of a 0.9% aqueous solution of TMAH to approximately 220 ml/l of a 0.9% aqueous solution of TMAH, such as from approximately 110 ml/l of a 0.9% aqueous solution of TMAH to approximately 200 ml/l of a 0.9% aqueous solution of TMAH, from approximately 110 ml/l of a 0.9% aqueous solution of TMAH to approximately 180 ml/l of a 0.9% aqueous solution of TMAH. In one embodiment, the composition includes approximately 110 ml/l of a 0.9% aqueous solution of TMAH (approximately 0.099 wt %). Aqueous TMAH solutions having a concentration as described above are commercially available from numerous sources.

The chelator may be a polydentate chelator, such as ethylenediamine tetraacetic acid (EDTA), diethylenetriaminepentaacetic acid (DTPA), nitrilotriacetic acid (NTA), ethylenediamine, diethylenetriamine, triethylenetetramine, tetraethylenepentamine, pentaethylenehexamine, tetramethylethylenediamine, or combinations thereof. The polydentate chelator may solubilize metal ions, metalloid ions, or chalcogen ions that may otherwise form water insoluble complexes with other materials of the stack structures. Thus, the formation of these insoluble complexes is reduced or eliminated. In some embodiments, the chelator is EDTA. The EDTA used in the composition may be approximately 99% pure. EDTA of such purity is commercially available from numerous sources. The EDTA may be present in the composition at from approximately 0.015 wt % to approximately 0.03 wt %, such as from approximately 0.025 wt % to approximately 0.03 wt %. By way of example only, the composition may include from approximately 0.15 g/l of 99% EDTA to approximately 0.30 g/l of 99% EDTA, such as from approximately 0.25 g/l of 99% EDTA to approximately 0.30 g/l of 99% EDTA. In one embodiment, the composition includes approximately 0.29 g/l of 99% EDTA (approximately 0.029 wt % EDTA). However, the concentration of the chelator in the composition may be increased beyond the above range if the concentration of TMAH is increased.

The degasser may be a glycol, such as ethylene glycol, propylene glycol, dipropylene glycol, ethylene glycol monomethyl ether, ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono-n-butyl ether, ethylene glycol dimethyl ether, ethylene glycol diethyl ether, ethylene glycol dibutyl ether, or combinations thereof. In some embodiments, the degasser is DGP. The DGP used in the composition may be approximately 99% pure. Such purity DGP is commercially available from numerous sources. The DPG may be present in the composition at from approximately 0.1 wt % to approximately 0.67 wt %, such as from approximately 0.129 wt % to approximately 0.139 wt %. By way of example only, the composition may include from approximately 1.00 g/l of 99% DGP to approximately 6.70 g/l of 99% DPG, such as from approximately 1.29 g/l of 99% DGP to approximately 1.39 g/l of 99% DPG. In one embodiment, the composition includes approximately 1.34 g/l of 99% DPG (approximately 0.134 wt %). However, the concentration of the degasser in the composition may be increased beyond the above range if corrosion of the stack structures by oxygen occurs. While the above listed glycols may be characterized as solvents in conventional cleaning compositions, the low concentration of glycol in the composition of the disclosure does not enable the glycol to function as a solvent.

The fluorine source may be ammonium fluoride, hydrogen fluoride, tetramethylammonium fluoride, triethylamine trihydrofluoride, hydrogen fluoride pyridine, or combinations thereof. In some embodiments, the fluorine source is ammonium fluoride ($NH_4F$). By including ammonium fluoride in the composition, the basic pH of the composition may be maintained while the effectiveness of the composition to remove residues is increased. While hydrogen fluoride may be used as the fluorine source, since hydrogen fluoride is an acid, the hydrogen fluoride may decrease the pH of the composition. The ammonium fluoride may be present in the composition at from approximately 0.0312 wt % to approximately 0.0352 wt %, such as approximately 0.0332 wt % ammonium fluoride. By way of example only, the composition may include from approximately 0.78 g/l of a 40% aqueous solution of ammonium fluoride to approximately 0.88 g/l of the 40% aqueous solution of ammonium fluoride, such as approximately 0.83 g/l of the 40% aqueous solution of ammonium fluoride. Such concentration of ammonium fluoride is commercially available from numerous sources. In one embodiment, the composition includes approximately 0.83 g/l of the 40% aqueous solution of ammonium fluoride (approximately 0.0332 wt % ammonium fluoride). The concentration of ammonium fluoride in the composition may be increased to improve the removal strength and removal rate of the composition without causing undercutting of the stack structures.

The composition may, optionally, include an additive, such as a surfactant, a siloxane, benzotriazole, or combinations thereof. The surfactant may be a nonionic surfactant or an anionic surfactant and may include, but is not limited to, an acetylenic diol surfactant. The siloxane resin may include, but is not limited to, a silsesquioxane, such as methylsilsesquioxane. The additive may be present in the composition at a low concentration, such that the ingredients of the composition other than the water account for less than approximately 5 wt % of the composition, such as less than approximately 1 wt % of the composition, less than or equal to approximately 0.8 wt % of the composition, or less than or equal to approximately 0.5 wt % of the composition.

In some embodiments, the composition includes TMAH, EDTA, DGP, ammonium fluoride, and water. The TMAH, EDTA, DGP, and ammonium fluoride, in combination, may account for from approximately 0.1 wt % to approximately 0.5 wt % of the composition, while the water accounts for greater than or equal to approximately 99.5 wt % of the composition. In some embodiments, the composition includes water, 110 ml/l of 0.9% aqueous TMAH, 0.29 g/l of EDTA, 1.34 g/l of DPG, and 0.83 g/l of 40% aqueous ammonium fluoride, with the composition having a pH of from approximately 10.0 to approximately 11.0, such as water, approximately 0.099 wt % TMAH, approximately 0.029 wt % of EDTA, approximately 0.134 wt % of DPG, and approximately 0.0332 wt % of ammonium fluoride.

In other embodiments of the composition of the disclosure, the ammonium fluoride is replaced with hydrogen fluoride to increase the rate of silicon oxide removal. The hydrogen fluoride may be a dilute HF solution, such as 1000:1 water:HF. In one such embodiment, the composition includes water, 10 g/l TMAH, 1 mM EDTA, 10 mM DPG, and 1 g/l HF, with the composition having a pH of approximately 10.0.

In other embodiments, the EDTA is replaced with another polydentate chelator, such as EDA or DPTA. In one such embodiment, the composition includes water, 8 g/l TMAH, 3 mM EDA, 10 mM DPG, and 1 g/l HF. In another such embodiment, the composition includes water, 14 g/l TMAH, 3 mM DPTA, 10 mM DPG, and 1 g/l HF.

Accordingly, a composition is disclosed. The composition comprises water, a base, a polydentate chelator, a degasser, and a fluorine source. The composition comprises greater than or equal to approximately 99 wt % of water and is formulated to exhibit a pH of from approximately 10.0 to approximately 12.0.

The composition may be formed by combining the polydentate chelator with the base. Once the polydentate chelator is dissolved in the base, the remainder of the ingredients may be added to produce the composition. By way of example only, the composition may be formed by combining EDTA with TMAH, dissolving the EDTA in the TMAH, and then adding the DGP and ammonium fluoride to produce the composition. The solubility of EDTA in TMAH decreases at a lower pH, so the EDTA is combined with the TMAH and solubilized before adding any ingredients that may lower the pH of the composition. To enable dissolution of the EDTA, the EDTA is added to the TMAH before the remaining ingredients are added.

Also disclosed is a method of forming a composition for removing residues from a semiconductor substrate. The method comprises dissolving ethylenediamine tetraacetic acid in a solution of water and tetramethylammonium hydroxide. Dipropylene glycol and ammonium fluoride are added to the solution to form the composition.

Without being bound by any theory, it is believed that the base in the composition of the disclosure provides increased water solubility to residues that contain metal ions, metalloid ions, or chalcogen ions. Thus, the ability of the metal ions, metalloid ions, or chalcogen ions to form complexes, which may precipitate on sidewalls of the stack structures, is decreased. The basic pH of the composition is believed to produce a chemically reductive environment in which the formation of insoluble metal complexes, insoluble metalloid complexes, or insoluble chalcogen complexes is limited. Thus, the composition of the disclosure may solubilize metal ions, metalloid ions, or chalcogen ions that may otherwise form water insoluble complexes with other materials of the stack structures. Thus, use of the base in the composition reduces or eliminates the formation of the insoluble metal complexes, insoluble metalloid complexes, or insoluble chalcogen complexes during the downstream processing acts. By solubilizing the metal ions, metalloid ions, or chalcogen ions, the composition may reduce cross contamination of other materials of the stack structures. In addition, the composition of the disclosure may solubilize the metal ions, metalloid ions, or chalcogen ions without damaging the organic materials, if present, or other exposed materials of the stack structures.

The composition of the disclosure may be used to remove residues from a 3D cross-point memory structure 100 that includes stack structures 102, as shown in FIG. 1. The stack structures 102 may include a conductive material 130 over a substrate 120, a bottom electrode 140 over the conductive material 130, a switching material 150 over the bottom electrode 140, a middle electrode 160 over the switching material 150, a phase change material 170 over the middle electrode 160, and a top electrode 180 over the phase change material 170. In some embodiments, additional materials (not shown) may be present, e.g., at one or more interfaces between the materials depicted in FIG. 1.

Figure 2:
FIG. 2 is an intermediate cross-point memory structure at an initial stage of processing.

The structure 100 may be formed by conventional techniques, which are not described in detail herein. Referring to FIG. 2, a 3D cross-point memory structure 200 at an intermediate processing stage is shown. The structure 200 may include various materials formed over a substrate 220. The substrate 220 may be a base material or construction upon which additional materials are formed. The substrate 220 may be a semiconductor substrate, a base semiconductor layer on a supporting structure, a metal electrode or a semiconductor substrate having one or more layers, structures or regions formed thereon. The substrate 220 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The structure 200 may include a conductive material 230 formed over the substrate 220. A bottom electrode material 240 may be formed over the conductive material 230. A switching material 250 may be formed over the bottom electrode material 240. A middle electrode material 260 may be formed over the switching material 250. A phase change material 270 may be forming over the middle electrode 260. A top electrode material 280 may be formed over the phase change material 270. The materials of the structure 200 may be forming on the substrate 220 by conventional techniques, which are not described in detail herein.

The conductive material 230 may comprise any conductive material including, but not limited to, tungsten, aluminum, copper, titanium, tantalum, platinum, alloys thereof, heavily doped semiconductor material, a conductive silicide, a conductive nitride, a conductive carbide, or combinations thereof. In some embodiments, the conductive material 230 is tungsten.

The bottom electrode material 240, the middle electrode material 260, and the top electrode material 280 may be forming from the same or different materials. The electrode materials 240, 260, 280 may be formed from a conductive material such as tungsten, platinum, palladium, tantalum, nickel, titanium nitride (TiN), tantalum nitride (TaN), tungsten nitride (WN), polysilicon, a metal silicide, or a carbon material. In some embodiments, the bottom electrode material 240, middle electrode material 260, and the top electrode material 280 are formed from a carbon material and are carbon electrodes.

Each of the switching material 250 and the phase change material 270 may be a chalcogenide material, such as a chalcogenide-metal ion glass or a chalcogenide glass. As used herein, the term "chalcogenide" means and includes a compound having at least one chalcogen element, such as sulfur, selenium, tellurium, or combinations thereof. The chalcogenide material may be a binary, tertiary, or ternary compound including the at least one chalcogen element and a more electropositive element, such as a metal element or a metalloid element. The electropositive element may include, but is not limited to, antimony, arsenic, bismuth, germanium, indium, oxygen, tin, or combinations thereof. The chalcogenide material may be doped or undoped or may have metal ions mixed therein. By way of non-limiting example, the chalcogenide material may include an alloy of indium, selenium, tellurium, antimony, arsenic, bismuth, germanium, oxygen, tin, or combinations thereof. The switching material 250 and the phase change material 270 may be formed of chalcogenide materials having the same composition or different compositions. In some embodiments, the switching material 250 and the phase change material 270 comprise different chalcogenide materials. In some embodiments, the switching material 250 is SeGeAr and the phase change material 270 is InSbTeGe.

Portions of the conductive material 230, bottom electrode material 240, switching material 250, middle electrode material 260, phase change material 270, and top electrode material 280 may be removed to expose a surface of the substrate 220 and form the stack structures 102 of structure 100 shown in FIG. 1. The desired portions of the materials may be removed by an anisotropic etch process, such as dry plasma etching or reactive ion etching. The desired portions of the materials may be removed through a mask or reticle (not shown) by conventional techniques, which are not described in detail herein. The resulting stack structures 102 may be separated from one another by a distance of between about 10 nm and about 60 nm, such as between about 20 nm and about 40 nm, or between about 40 nm and about 60 nm.

The structure 100 may be exposed to a composition according to an embodiment of the disclosure to remove the residues produced during the fabrication of the structure 100. By way of example only, the composition may be applied to the structure 100 by spin coating or other suitable technique that does not damage the stack structures 102. The composition may contact the structure 100 for an amount of time sufficient to remove the residues, such as from approximately 10 seconds to approximately 120 seconds, from approximately 30 seconds to approximately 90 seconds, or from approximately 30 seconds to approximately 60 seconds. The composition may be maintained at room temperature (from approximately 20° C. to approximately 25° C.) during exposure to the structure 100. The composition may be in contact with the structure 100 for a shorter amount of time at a higher temperature. However, the structure 100 should not be exposed to a temperature greater than approximately 30° C. The composition may remove the residues without damaging the stack structures 102. By way of example only, if the stack structures 102 include electrodes 140, 160, 180 formed from carbon, the residues may be removed without damaging or otherwise degrading the carbon electrodes, the switching material 150, and the phase change material 170.

While removing residues from a 3D cross-point memory structure 100 that includes stack structures 102 has been described and illustrated herein, the compositions of the disclosure may also be used to clean other semiconductor structures having exposed chalcogenide materials, exposed electrode materials (e.g., carbon materials), or other exposed materials. By way of example only, the compositions of the disclosure may be used to clean magnetic memory structures having exposed chalcogenide materials or other exposed materials.

Also disclosed in a method of removing residues from a semiconductor structure. The method comprises exposing a semiconductor structure to a composition to remove residues from the semiconductor structure. The semiconductor structure comprises at least one exposed chalcogenide material. The composition comprises water, a base, a polydentate chelator, a degasser, and a fluorine source. The composition comprises greater than or equal to approximately 99 wt % of the water and is formulated to exhibit a pH of from approximately 10.0 to approximately 12.0.

Another method of removing residues from a semiconductor structure is also disclosed. The method comprises forming a semiconductor structure comprising at least one chalcogenide material and an organic material in a stack structure. The semiconductor structure is exposed to a composition to remove residues from the semiconductor structure. The composition comprises water, a base, a polydentate chelator, a degasser, and a fluorine source. The composition comprises greater than or equal to approximately 99 wt % of the water and is formulated to exhibit a pH of from approximately 10.0 to approximately 12.0.

After removing the residues, additional process acts may then be conducted to form a complete 3D cross-point memory structure from the structure 100 in FIG. 1. The additional process acts may be formed by conventional techniques, which are not described in detail herein.

To remove additional residues, the structure 100 may, optionally, be exposed to a hydrogen plasma before or after exposing the structure 100 to an embodiment of the composition of the disclosure. The structure 100 may be exposed to the hydrogen plasma for from approximately 1 second to approximately 60 seconds at a power of from approximately 300 W to approximately 1500 W, such as at approximately 500 W. In one embodiment, the structure 100 is exposed to the hydrogen plasma for approximately 8 seconds at a power of approximately 1000 W. While exposure of the structure 100 to an embodiment of the composition of the disclosure alone provides effective removal of the residues, subjecting the structure 100 to the hydrogen plasma may increase the residue removal. Without being bound by any theory, it is believed that the hydrogen plasma removes native metal oxides, such as indium oxides, selenium oxides, of tellurium oxides, from the stack structures 102.

The structures 100 exposed to an embodiment of the composition of the disclosure may have improved electrical properties compared to those exposed to conventional solvent- or acid-based compositions. By way of example only, the structures 100 may have improved vertical leakage, bit error rate, switch speed and health of the chalcogenide materials, programming window, and clock speed. In addition, since embodiments of the compositions of the disclosure include mostly water, the cost of the compositions may be substantially less than that of conventional solvent- or acid-based compositions used to remove residues. Embodiments of the compositions of the disclosure may have an approximately 100 times cost reduction per liter compared to conventional solvent- or acid-based compositions.

The following examples serve to explain embodiments of the disclosure in more detail. The examples are not to be construed as being exhaustive or exclusive as to the scope of the disclosure.

EXAMPLES

Example 1

The ability of different compositions to remove residues from stack structures following fabrication of the stack structures was tested by exposing coupons to each of Compositions A-N for six hours. Each of Compositions A-N included water and the ingredients indicated in Table 1. The coupons included stack structures formed of chalcogenide materials and organic materials. The materials of the stack structures included three metal, metalloid, or chalcogen elements, which are referred to in Table 1 as M1, M2, and M3. Inductively coupled plasma mass spectrometry (ICPMS) leaching studies of M1, M2, and M3 were conducted by conventional techniques, which are not described in detail herein. The solubility of each of M1, M2, and M3 in the compositions following the six-hour exposure is reported in Table 1 in parts per billion (ppb).

TABLE 1

Six-Hour Leaching Studies of Ammonium Hydroxide-Containing Compositions and TMAH-Containing Compositions.

|   | Ingredients | pH | M1 (ppb) | M2 (ppb) | M3 (Ppb) |
|---|---|---|---|---|---|
| A | 39 mM citric acid (control) | 2.1 | 27.0 | 85.0 | 125.0 |
| B | 100:1 ammonia | 10.7 | 97.4 | 397.5 | 2.8 |
| C | 10 mM EDTA + 0.29 wt % NH$_4$OH | 9.4 | 386.3 | 1269.3 | 511.7 |
| D | 19 mM EDTA + 0.29 wt % NH$_4$OH | 9.2 | 441.5 | 1509.3 | 621.5 |
| E | 39 mM EDTA + 0.29 wt % NH$_4$OH | 8.9 | 470.1 | 1603.7 | 721.8 |
| F | 0.29 wt % NH$_4$OH + 1 mM EDTA + 10 mM DPG | 10.4 | 407.0 | 1510.0 | 682.0 |
| G | 0.065 wt % TMAH + 1 mM EDTA + 10 mM DPG | 11.4 | 306.0 | 1580.0 | 143.0 |
| H | 0.29 wt % NH$_4$OH + 1 mM EDTA + 0.13 wt % DPG + 0.03 wt % NH$_4$F | 10.0 | 331.0 | 1210.0 | 560.0 |
| I | 0.065 wt % TMAH + 1 mm EDTA + 10 mM DPG + 0.03 wt % NH$_4$F | 10.1 | 396.0 | 2050.0 | 396.0 |
| J | 100:1 NH$_4$OH/DPG/EDTA | 10.4 | 331.3 | 1173.5 | 461.0 |
| K | 500:1 HF | 1.9 | 350.0 | 570.0 | 768.0 |
| L | 2000:1 HF | 2.0 | 93.0 | 74.0 | 4.1 |
| M | 39 mM EDTA | 2.5 | 127.7 | 118.7 | 254.5 |
| N | 0.5 wt % TMAH | 11.5 | 802.0 | 1516.0 | 1484.9 |

Compared to Composition A, which is an acid-based composition and was used as a control, Compositions B and G exhibited increased solubilities of M1 and M2. Each of Compositions C-F, H-K, M, and N exhibited increased solubilities of M1, M2, and M3 relative to the solubilities of M1, M2, and M3 exhibited by Composition A. The coupon exposed to Composition I exhibited the best cleaning and little or no cross contamination and damage to the coupon. Composition L, however, exhibited decreased solubilities of M2 and M3. In addition, upon inspection by x-ray secondary emission microscopy (XSEM) and tunneling electron microscopy (TEM) (results not shown), the coupons exposed to Compositions A and K-M, which are more acidic than Composition I, exhibited high cross contamination of the stack structures, and oxide etching and undercutting of the coupon exposed to Composition K was observed. With Composition N, the coupon was damaged, indicating the TMAH was present at too high (0.5%) of a concentration.

While the ammonium hydroxide-containing compositions (Compositions F and H) and the TMAH-containing compositions (Compositions G and I) were effective to solubilize M1, M2, and/or M3, the TMAH-containing compositions were more effective, which is believed to be due to the higher pH of the composition at a lower molar concentration of TMAH. In contrast, in the ammonium hydroxide-containing compositions (Compositions F and H), the pH of the composition is lower, so the solubilizing ability of the polydentate chelator (EDTA) is less effective.

As comparison of the M1, M2, and M3 solubilities of Compositions F and H shows, adding ammonium fluoride to the ammonium hydroxide-containing composition (Composition H), did not increase the M1, M2, and M3 solubilities. Rather, the M1, M2, and M3 solubilities decreased when ammonium fluoride was added to Composition F. However, as comparison of the M1, M2, and M3 solubilities of Compositions G and I shows, adding ammonium fluoride to the TMAH-containing composition (Composition I), increased the ML M2, and M3 solubilities.

Similar studies were conducted on TMAH-containing compositions with and without other additives. The ability of different compositions to remove residues from stack structures following fabrication of the stack structures was tested by exposing coupons to each of Compositions I, L, and O-T for six hours. Each of Compositions I, L, and O-T included water and the ingredients indicated in Table 2. The coupons included stack structures formed of chalcogenide materials and organic materials. The materials of the stack structures included six metal, metalloid, or chalcogen elements, which are referred to in Table 2 as M1, M2, M3, M4, M5, and M6. ICPMS leaching studies of M1, M2, M3, M4, M5, and M6 were conducted by conventional techniques, which are not described in detail herein. The solubility of each of M1, M2, M3, M4, M5, and M6 in the compositions following the six-hour exposure is reported in Table 2 in parts per billion (ppb).

TABLE 2

Six-Hour Leaching Studies of TMAH-Containing Compositions with Additional Additives.

|   | Ingredients | M1 (ppb) | M2 (ppb) | M3 (ppb) | M4 (ppb) | M5 (ppb) | M6 (ppb) |
|---|---|---|---|---|---|---|---|
| Blank | 0.065 wt % TMAH + 1 mm EDTA + 10 mm DPG + 0.03 wt % NH$_4$F (blank) | 0.1 | 0.1 | 0.1 | 0.1 | 0.1 | 0.1 |
| I | 0.065 wt % TMAH + 1 mm EDTA + 10 mm DPG + 0.03 wt % NH$_4$F | 7 | 15.4 | 1.42 | 9.19 | 13.7 | 6.21 |
| L | 2000:1 HF | 15.9 | 3.17 | 46.3 | 6.57 | 17 | nd |
| O | 0.065 wt % TMAH + 1 mm EDTA + 10 mm DPG + 0.03 wt % NH$_4$F + siloxane | 6.34 | 12.6 | 1.29 | 7.02 | 10.8 | 5.02 |
| P | 0.065 wt % TMAH + 1 mm EDTA + 10 mm DPG + 0.03 wt % NH$_4$F + 0.04 wt % phosphonic acid | 5.54 | 10.2 | 1.49 | 5.44 | 9.69 | 1.24 |
| Q | 0.065 wt % TMAH + 1 mm EDTA + 10 mm DPG + 0.03 wt % NH$_4$F + 0.03 wt % BTA | 7.47 | 12.6 | 2.02 | 6.47 | 10.7 | 1.91 |

TABLE 2-continued

Six-Hour Leaching Studies of TMAH-Containing Compositions with Additional Additives.

| | Ingredients | M1 (ppb) | M2 (ppb) | M3 (ppb) | M4 (ppb) | M5 (ppb) | M6 (ppb) |
|---|---|---|---|---|---|---|---|
| R | 0.065 wt % TMAH + 1 mm EDTA + 10 mM DPG + 0.03 wt % NH$_4$F + 0.04 wt % siloxane | 15.8 | 3.91 | 83.2 | 8.16 | 19.6 | nd |
| S | 0.065 wt % TMAH + 1 mm EDTA + 10 mM DPG + 0.03 wt % NH$_4$F + 0.02 wt % SURFYNOL ® | 15.2 | 5.26 | 35.1 | 8.32 | 20.2 | nd |
| T | 0.065 wt % TMAH + 1 mm EDTA + 10 mM DPG + 0.03 wt % NH$_4$F + 0.15 wt % polyethylene glycol monomethyl ether | 15.8 | 6.04 | 30.5 | 8.27 | 19.1 | nd | siloxane = methylsilsesquioxane
BTA = benzotriazole
SURFYNOL ® = an anionic surfactant As shown in Table 2, Compositions O-T exhibited comparable solubilities of M1, M2, M3, M4, M5, and M6 relative to the solubilities exhibited by Composition I. Thus, additives, such as a siloxane, an inorganic compound, benzotriazole, an anionic surfactant, or polyethylene glycol monomethyl ether may be used in the compositions to effectively remove the residues.

Similar leaching studies were conducted on TMAH-containing compositions with different polydentate chelators and using hydrogen fluoride as the fluorine source instead of ammonium fluoride. The ability of the different compositions to remove residues from stack structures following fabrication of the stack structures was tested by exposing coupons to each of Compositions U-X for six hours. Each of Compositions U-X included water and the ingredients indicated in Table 3. The coupons included stack structures formed of chalcogenide materials and organic materials. The materials of the stack structures included six metal, metalloid, or chalcogen elements, which are referred to in Table 3 as M1, M2, M3, M4, M5, and M6. ICPMS leaching studies of M1, M2, M3, M4, M5, and M6 were conducted by conventional techniques, which are not described in detail herein. The solubility of each of M1, M2, M3, M4, M5, and M6 in the compositions following the six-hour exposure is reported in Table 3 in parts per billion (ppb).

TABLE 3

Six-Hour Leaching Studies of TMAH-Containing Compositions with Other Polydentate Chelators.

| Composition | pH | M1 (ppb) | M2 (ppb) | M3 (ppb) | M4 (ppb) | M5 (ppb) | M6 (ppb) |
|---|---|---|---|---|---|---|---|
| U | 1000:1 HF | | 14.9 | 12.9 | 44.8 | 4.27 | 14.2 | 0.115 |
| V | 14 g/l TMAH + 3 mM DPTA + 10 mM DPG + 1 g/l HF | 10 | 0.779 | 12.9 | 2.45 | 5.9 | 4.32 | 2.32 |
| W | 8 g/l TMAH + 3 mM EDA + 10 mM DPG + 1 g/l HF | 10 | 1.17 | 13.3 | 0.751 | 4.16 | 4.43 | 1.02 |
| X | 10 g/l TMAH + 1 mM EDTA + 10 mM DPG + 1 g/l HF | 10 | 0.843 | 13.5 | 1.48 | 6.22 | 4.91 | 1.79 |

Composition V, which included DPTA as the polydentate chelator, had the best removal of high electrochemical potential metals or metalloids. However, Composition V caused increased etching of the chalcogenide materials and had the highest TMAH concentration due to needing a 3.5 times increase in TMAH concentration relative to Composition I because of impacts to the pH of the composition.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A composition for removing residues from a semiconductor structure, the composition comprising:
water, a base, a polydentate chelator, a degasser comprising dipropylene glycol (DPG), and a fluorine source, the composition comprising greater than or equal to approximately 99 wt % of water and formulated to exhibit a pH of from approximately 10.0 to approximately 12.0.

2. The composition of claim 1, wherein the composition comprises greater than or equal to approximately 99.5 wt % of water.

3. The composition of claim 1, wherein the base, the polydentate chelator, the dipropylene glycol (DPG), and the fluorine source, in combination, comprise less than or equal to approximately 0.5 wt % of the composition.

4. The composition of claim 1, wherein the base comprises tetramethylammonium hydroxide (TMAH), tetraethylammonium hydroxide, ammonia, ammonium hydroxide, an alkaline or alkali metal hydroxide, or combinations thereof.

5. The composition of claim 1, wherein the polydentate chelator comprises ethylenediamine tetraacetic acid (EDTA), diethylenetriaminepentaacetic acid (DTPA), nitrilotriacetic acid (NTA), ethylenediamine, diethylenetriamine, triethylenetetramine, tetraethylenepentamine, pentaethylenehexamine, tetramethylethylenediamine, or combinations thereof.

6. The composition of claim 1, wherein the composition comprises from approximately 0.1 wt % to approximately 0.67 wt % of the dipropylene glycol (DPG).

7. The composition of claim 1, wherein the fluorine source comprises ammonium fluoride, hydrogen fluoride, or combinations thereof.

8. The composition of claim 1, wherein the composition comprises water, tetramethylammonium hydroxide (TMAH), ethylenediamine tetraacetic acid (EDTA), dipropylene glycol (DPG), and ammonium fluoride, wherein the water comprises greater than or equal to approximately 99.5 wt % of the composition.

9. The composition of claim 1, wherein the composition comprises water, tetramethylammonium hydroxide (TMAH), ethylenediamine tetraacetic acid (EDTA), dipropylene glycol (DPG), and hydrogen fluoride, wherein the water comprises greater than or equal to approximately 99.5 wt % of the composition.

10. The composition of claim 1, further comprising at least one of a nonionic surfactant, an anionic surfactant, a siloxane, and benzotriazole.

11. The composition of claim 1, wherein the composition consists of water, tetramethylammonium hydroxide (TMAH), ethylenediamine tetraacetic acid (EDTA), dipropylene glycol (DPG), and ammonium fluoride, wherein the water comprises greater than or equal to approximately 99.5 wt % of the composition.

12. The composition of claim 1, wherein the composition comprises water, approximately 0.099 wt % tetramethylammonium hydroxide (TMAH), approximately 0.029 wt % of ethylenediamine tetraacetic acid (EDTA), approximately 0.134 wt % of dipropylene glycol (DPG), and approximately 0.0332 wt % of ammonium fluoride.

13. The composition of claim 1, wherein the pH of the composition is from approximately 10.0 to approximately 11.0.

14. A method of removing residues from a semiconductor structure, the method comprising:
exposing a semiconductor structure to a composition to remove residues from the semiconductor structure, the semiconductor structure comprising at least one exposed chalcogenide material and the composition comprising water, a base, a polydentate chelator, a degasser comprising dipropylene glycol (DPG), and a fluorine source, the composition comprising greater than or equal to approximately 99 wt % of water and formulated to exhibit a pH of from approximately 10.0 to approximately 12.0.

15. The method of claim 14, wherein exposing a semiconductor structure to a composition to remove residues from the semiconductor structure comprises removing the residues from the semiconductor structure without damaging at least one other exposed material.

16. The method of claim 14, wherein exposing a semiconductor structure to a composition to remove residues from the semiconductor structure comprises removing the residues from the semiconductor structure without damaging at least one exposed carbon material.

17. A method of removing residues from a semiconductor structure, the method comprising:
forming a semiconductor structure comprising at least one chalcogenide material and an organic material in a stack structure; and
exposing the semiconductor structure to a composition to remove residues from the semiconductor structure, the composition comprising:
water, a base, a polydentate chelator, a degasser comprising dipropylene glycol (DPG), and a fluorine source, the composition comprising greater than or equal to approximately 99 wt % of water and formulated to exhibit a pH of from approximately 10.0 to approximately 12.0.

18. The method of claim 17, wherein forming a semiconductor structure comprising at least one chalcogenide material and an organic material in a stack structure comprises forming at least two stack structures on a substrate of the semiconductor structure.

19. The method of claim 17, wherein forming a semiconductor structure comprising at least one chalcogenide material and an organic material in a stack structure comprises forming the stack structure comprising a phase change material, a switching material, and carbon electrodes.

20. The method of claim 17, wherein forming a semiconductor structure comprising at least one chalcogenide material and an organic material in a stack structure comprises forming the stack structure comprising a conductive material on a substrate, a first carbon electrode on the conductive material, a switching material on the first carbon electrode, a second carbon electrode on the switching material, a phase change material on the second carbon electrode, and a third carbon electrode on the phase change material.

21. The method of claim 17, wherein exposing the semiconductor structure to a composition comprises spin coating the composition on the semiconductor structure.

22. The method of claim 17, wherein exposing the semiconductor structure to a composition comprises exposing the semiconductor structure to the composition for from approximately 30 seconds to approximately 90 seconds.

23. The method of claim 17, wherein exposing the semiconductor structure to a composition comprises removing the residues from the semiconductor structure without damaging the at least two chalcogenide materials and the organic material.

24. The method of claim 17, further comprising exposing the semiconductor structure to a hydrogen plasma after exposing the semiconductor structure to the composition.

25. A method of forming a composition for removing residues from a semiconductor structure, the method comprising:
dissolving ethylenediamine tetraacetic acid in a solution of water and tetramethylammonium hydroxide; and
adding dipropylene glycol and ammonium fluoride to the solution to form the composition.

26. The composition of claim 1, wherein the degasser further comprises ethylene glycol, propylene glycol, ethylene glycol monomethyl ether, ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono-n-butyl ether, ethylene glycol dimethyl ether, ethylene glycol diethyl ether, ethylene glycol dibutyl ether, or combinations thereof.

* * * * *

UNITED STATES PATENT AND TRADEMARK OFFICE
CERTIFICATE OF CORRECTION

PATENT NO. : 9,593,297 B2  
APPLICATION NO. : 14/514656  
DATED : March 14, 2017  
INVENTOR(S) : Cole S. Franklin and Jerome A. Imonigie Page 1 of 1

It is certified that error appears in the above-identified patent and that said Letters Patent is hereby corrected as shown below:

In the Specification

Column 6, Line 43, change "be forming over" to --be formed over--
Column 6, Line 46, change "be forming on" to --be formed on--
Column 6, Line 56, change "forming from" to --formed from--
Column 10, Line 26, change "the ML M2," to --the M1, M2--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*